United States Patent [19]

Freeman et al.

[11] Patent Number: 5,432,719

[45] Date of Patent: Jul. 11, 1995

[54] DISTRIBUTED MEMORY ARCHITECTURE FOR A CONFIGURABLE LOGIC ARRAY AND METHOD FOR USING DISTRIBUTION MEMORY

[75] Inventors: Ross H. Freeman, San Jose; Hung-Cheng Hsieh, Sunnyvale, both of Calif.

[73] Assignee: Xilinx, Inc., San Jose, Calif.

[21] Appl. No.: 284,935

[22] Filed: Aug. 1, 1994

Related U.S. Application Data

[62] Division of Ser. No. 387,566, Jul. 23, 1989, Pat. No. 5,343,406.

[51] Int. Cl.[6] .......................................... H03K 19/003
[52] U.S. Cl. .................................. 364/579; 364/488; 364/490
[58] Field of Search ............... 364/488, 489, 490, 491, 364/579; 340/825.83, 825.87; 365/181, 230.03; 307/469, 465; 357/45, 42; 371/22.7

[56] References Cited

U.S. PATENT DOCUMENTS

| | | | |
|---|---|---|---|
| 4,422,160 | 12/1983 | Watanabe | 365/189 |
| 4,791,602 | 12/1988 | Resnick | 307/465 |
| 4,791,603 | 12/1988 | Henry | 307/465 |
| 4,796,234 | 1/1989 | Itoh et al. | 365/227 |
| 4,845,633 | 7/1989 | Furtek | 364/490 |
| 4,873,459 | 10/1989 | El Gamal et al. | 307/465 |
| 4,876,466 | 10/1989 | Kondou et al. | 307/465 |
| 4,879,684 | 11/1989 | Krauss et al. | 365/189 |
| 4,881,200 | 11/1989 | Urai | 365/189 |
| 4,896,296 | 1/1990 | Turner et al. | 365/189 |
| 4,942,319 | 7/1990 | Pickett et al. | 307/465 |
| 4,972,105 | 11/1990 | Burton et al. | 307/465 |
| 4,975,601 | 12/1990 | Steele | 307/465 |
| 4,990,992 | 2/1991 | Uchida | 357/41 |
| 4,998,223 | 3/1991 | Akaogi | 365/230 |
| 5,021,689 | 6/1991 | Pickett et al. | 307/465 |
| 5,109,353 | 4/1992 | Sample et al. | 364/578 |
| 5,216,636 | 6/1993 | Runaldue | 365/230 |
| 5,231,588 | 7/1993 | Agrawal | 364/488 |

FOREIGN PATENT DOCUMENTS 0238642 10/1987 Japan ............................. 365/230

OTHER PUBLICATIONS

Xilinx Programmable Gate Array Data Book, 1988, available from Xilinx, Inc., 2100 Logic Drive, San Jose, California 95124.

Marchand, "An Alterable Programmable Logic Array", IEEE Journal of Solid State Circuits, vol. SC-20, No. 5, pp. 1061-1066, Oct. 1985.

Primary Examiner—Ellis B. Ramirez
Attorney, Agent, or Firm—Edel M. Young

[57] ABSTRACT

This invention provides additional circuitry for a configurable logic array having logic functions which are programmed by loading memory cells which cause the logic array to generate a desired function. With the additional circuitry, the memory cells can also be used as memory for access by other parts of the logic array during operation.

3 Claims, 11 Drawing Sheets

LOGIC CELL ARRAY
STRUCTURE
(PRIOR ART)

=  i.e. no possible connection

=  or  (can be connected or disconnected)

= Full interchange - e.g. Figure 2d

= Full interchange - e.g. Figure 2c

= Partial interchange:

= Bidirectional amplifier (buffer)

Lines not having  intersections are long lines intended to be low skew paths, for example clock paths.

Circled numbers on ends of each pass transistor indicate which paths are connected by that pass transistor.

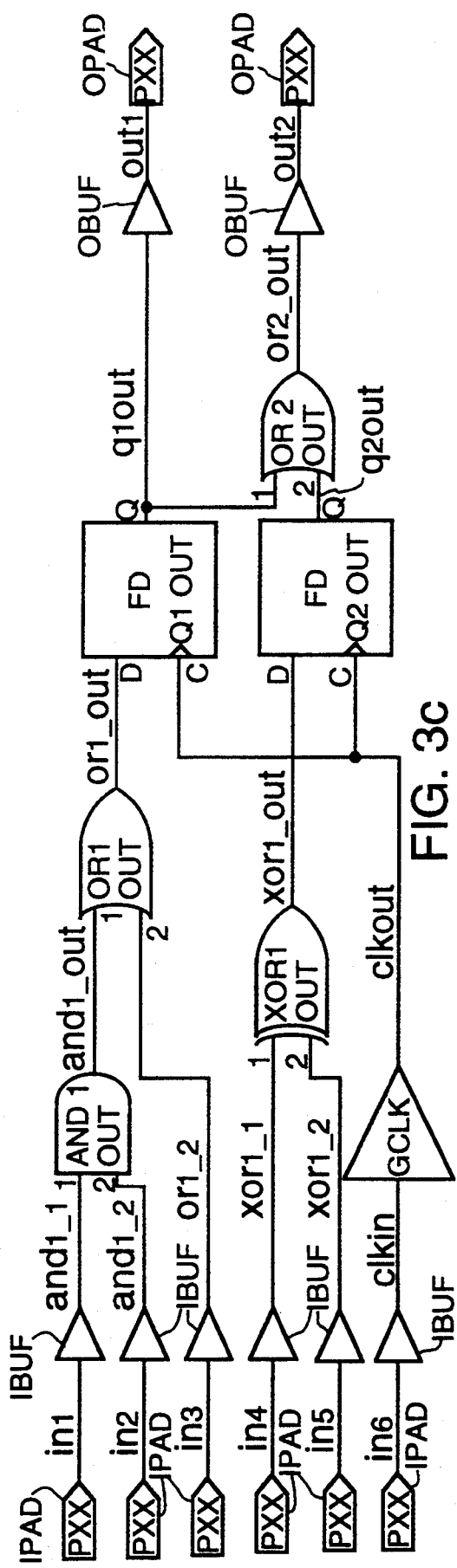
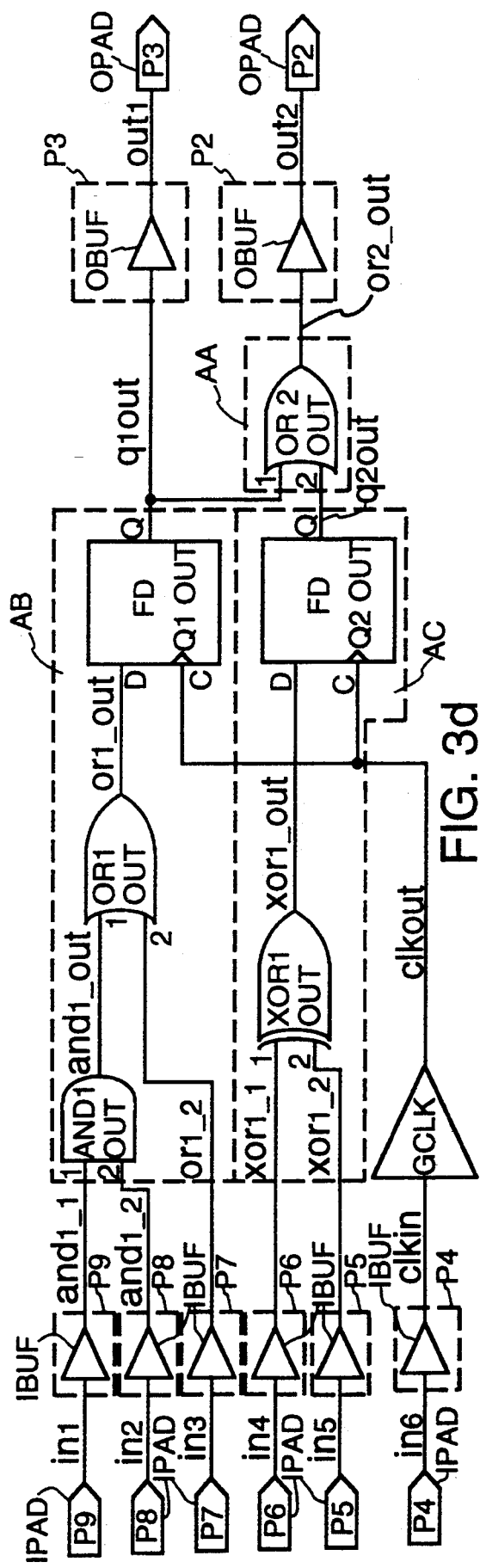
FIG. 3c
FIG. 3d

DISTRIBUTED MEMORY ARCHITECTURE FOR A CONFIGURABLE LOGIC ARRAY AND METHOD FOR USING DISTRIBUTION MEMORY

This is a divisional of application Ser. No. 07/387,566, filed Jul. 23, 1989, now U.S. Pat. No. 5,343,406.

FIELD OF THE INVENTION

This invention relates to means and methods of performing custom logic functions in an integrated circuit logic device.

BACKGROUND

As integrated circuit devices have become able to perform more functions within a single integrated circuit chip, the manufacturers of integrated circuit chips have developed ways of automatically and quickly responding to orders for custom chips to perform specific functions for specific applications. On the one hand, gate array manufacturers apply custom metallization layers as a final step in a-standard manufacturing process in order to connect transistors located within a semiconductor substrate to perform a particular logic function ordered by a customer. On the other hand, for customers who make frequent design changes, who want only small numbers of identical devices, or who may not have fully tested a new design, user programmable integrated circuit chips are available. In a user programmable device, there are many pass transistors which can be turned on or off to connect or not connect corresponding lines to logic circuits, to other lines, or output pins. By turning on the proper combination of pass transistors and connecting the proper set of lines a user can obtain a desired logic function. The user can reprogram a different design into the chip by turning on different combinations of pass transistors.

Xilinx, Inc. the assignee of the present invention, manufactures configurable logic arrays having a higher level of integration than typical programmable logic arrays. A Xilinx configurable logic array includes an array of logic blocks, each of which can be configured to perform a desired logic function (each logic block combining multiple AND, OR, MUX gates or FLIP-FLOPs for example). The Xilinx configurable logic array also includes interconnect lines which can be programmed to connect individual logic blocks to achieve the overall complex logic function provided by the entire chip. In the current Xilinx products, two kinds of configurable blocks are used in a configurable logic array chip. Around the perimeter of the chip, and connected to each of the external pins are input/output logic blocks which can be programmed to connect input buffers or output buffers to the pin and to perform some logic functions. In the interior of the chip are logic blocks which do not offer the input/output buffer option but offer more logic functions within a single block.

FIG. 1 shows part of one of the configurable logic array chips for which automatic programming is available. Configurable input/output blocks IO1 through IO15 are shown. Configurable logic blocks CLB11–CLB14, CLB21–CLB24, CLB31–CLB34 and CLB41–CLB44 are shown. Each of the configurable blocks implements a plurality of logic gates such as AND, OR, XOR, INVERT, and MUX, as well as TRI-STATE buffers and FLIPFLOP's which can be combined to implement a plurality of more complex logic functions.

The logic gates of a logic block are formed into flexible functions which are specified when the block is configured. For example the logic block may include a four-input AND gate. Zero, one two, three or four AND gate inputs need be used, the unused inputs being connected to the positive voltage supply. An input signal may pass directly or through an inverter to the AND gate. Since gates within a block are physically located and connected together in the substrate and adjoining layers of the semiconductor material, any desired one of a plurality of functions such as AND, OR, NAND, NOR, XOR of two inputs A and B can be performed by electronic components located in close physical proximity, therefore the signal delay caused by the logic block is minimal in spite of the flexibility and complexity of the logic block. One type of logic block is programmed to provide a desired function of several input signals by loading memory cells of a look-up table with the truth table of a desired logic function. This way great flexibility is achieved with minimum signal delay.

These configurable blocks each have input and output leads for receiving input signals and providing output signals. These leads are shown in FIG. 1 as short lines extending outward from each of the blocks and not connected to other portions of the array. These configurable blocks also have configuration leads not shown in FIG. 1 for programming the particular logic function or loading the truth table. The configuration leads determine what logic function will be applied by the block to signals entered on its input leads to generate a signal placed by the block on its output lead or leads. These logic blocks are discussed in U.S. Pat. No. 4,706,216 issued Nov. 10, 1987, which is incorporated herein by reference.

Available to connect these logic blocks to each other are interconnect lines with programmable interconnects, such as shown in FIG. 2. FIG. 2 shows in more detail a smaller portion of a configurable logic array chip with the interconnect lines for connecting one configurable logic block (CLB) or input/output block (IOB) to another CLB or IOB. Some of the interconnect lines are short segments which extend only a short part of the distance across the entire array, and others typically extend in one dimension the entire length or width of the array. FIG. 2b is a legend showing meanings for the marks in FIG. 2a. Diagonal lines indicate programmable pass transistors for connecting horizontal lines to vertical lines. Each transistor will have one current carrying terminal connected to a horizontal line and one to a vertical line. The control terminals of the transistors are not shown in FIG. 2a but are each connected to a memory cell into which a zero or one is entered. The zero or one in the memory cell causes the horizontal line to be connected or not connected to the vertical line. Transistors are also placed at ends of segmented lines to control the continuity of adjacent segments. Each of these transistors is also controlled by a memory cell. FIG. 2c shows in more detail this full-exchange interconnection indicated by an "X" in FIG. 2a. Line 90-4 is segmented from line 90-1 in that it is connected to line 90-1 by N-channel pass transistor T5 when memory cell M5 holds a logical 1 and disconnected from line 90-1 when memory cell M5 holds a logical 0. Likewise line 90-4 is connected to line 90-3 by transistor T1 when memory cell M1 holds a logical 1 and disconnected when memory cell M1 holds a logical 0. A set of memory cells thus controls the configuration of the interconnect lines interconnecting the logic blocks in the array. FIGS. 2a through 2d are discussed more fully in U.S. Pat. No. 4,870,302 incorporated herein by reference.

FIG. 3a shows one possible CLB which is part of a configurable logic array and can be configured to perform many different logic functions. FIG. 3a shows combinatorial function generator 354 having input lines 381–385 for receiving logic block inputs a-e and input lines 367 and 380 for receiving output signals from D-flipflops 352 and 357 respectively. Combinatorial function generator 354 also provides two combinatorial output, functions F and G on lines 374 and 378, each of which may serve as input to either or both flipflops 352 and 357 as controlled by multiplexers 350, 351, 355 and 356. Output functions F and G may also be provided as logic block output signals X and Y respectively on lines 395 and 396 as controlled by multiplexers 353 and 358. Which functions are actually implemented by the logic block of FIG. 3a depends upon the settings of configuration control lines not shown in FIG. 3a. For an embodiment similar to that of FIG. 3a having four input lines A–D instead of the five input lines 381-385 of FIG. 3a, configuration control lines are shown in FIG. 3b as lines extending from RAM 108 or 109 to select multiplexer 110 or 111. Combinatorial function generator 354 of FIG. 3a generates two cominatorial functions F and G just as block 100 of FIG. 3b generates two combinatorial functions F1 and F2. FIG. 3b is discussed in U.S. Pat. No. 4,706,216, ibid. Combinatorial function generator 354 can generate any combinatorial function of five variables, or can generate two functions of four variables each. In current Xilinx logic blocks combinatorial function generator 354 is programmed by loading a truth table into a row of memory cells. As is well known, an n-input multiplexer can select one of $2^n$ locations in response to an n-bit address. Function generator 354 is a multiplexer which reads one of 32 ($2^5$) memory cells in response to an address which comprises the five input signals on lines 381-385, or alternatively reads one of sixteen memory cells to provide a first function of four of the variables on a first output line, and reads one of a second sixteen memory cells to provide a second function of any four of the five variables on a second output line 378. The operation of the logic block of FIG. 3a is described more thoroughly in the Xilinx "Programmable Gate Array Data Book", copyright 1988 by Xilinx, Inc., available from Xilinx, Inc., 2100 Logic Drive, San Jose, Calif. 95124.

A logic array including configurable blocks such as shown in FIG. 3a or 3b and interconnect lines such as shown in FIG. 2a can be configured to perform a multiplicity of complex logic functions. For example, it can be programmed to perform the function which is represented by the schematic diagram of FIG. 3c. The schematic of FIG. 3c includes input buffers, logic gates AND1OUT, XOR1OUT, OR1OUT, and OR2OUT, flip flops Q1OUT and Q2OUT, and output buffers. As shown in FIG. 3d, the input and output buffers are provided by input/output blocks P2 through P9. These blocks are located at the periphery of the logic array chip. Gates AND1OUT and OR1OUT and flip flop Q1OUT are implemented in logic block AB; gate XOR1OUT and flip flop Q2OUT are implemented in logic block AC, and gate OR2OUT is implemented in logic block AA. Logic blocks AA, AB, and AC can be of the type shown in FIG. 3b. By placing the output of buffers P9, P8, and P7 (FIG. 3d) on leads A, B, and C (FIG. 3b) respectively, setting MUX 104 of FIG. 3b (by loading a memory cell not shown) to provide signal A, MUX 105 to provide signal B, and MUX 106 to provide signal C, and by loading the appropriate truth table into 8-bit RAM 109, signals A, B, and C will cause multiplexer 111 to select the value from RAM 109 to represent the function in FIG. 3d of a two input AND gate plus a third signal serving as input to a two input OR gate. By setting MUX 114 to provide this output as signal F1 and setting MUX 126 to provide this signal as input to flip flop 121, flip flop 121 can be configured to implement flipflop Q1OUT of FIG. 3d. Multiplexers 122 and 142 of FIG. 3b can be configured to provide the Qff output signal of flip flop 121 as the Y output of the logic block. In this way the logic block of FIG. 3b implements the logic shown in block AB of FIG. 3d. Similarly, other logic blocks of the type shown in FIG. 3b can implement the logic shown in blocks AC and AA of FIG. 3d.

Although memory cells have been used in existing logic arrays to control the logic functions performed by the arrays by writing values to the memory cells such as 8-bit RAM 109 of FIG. 3b during a configuration step, these memory cells have not been accessible to a user of the logic array for writing, storing, and reading data during operation of the logic array, as will now be explained.

The prior art memory cell of FIG. 4 comprises two inverters 41 and 42 connected in a loop such that the input of one inverter is connected to the output of the other inverter. Data line (or bit line) Dy is connected to or disconnected from the inverter by address line (or word line) Ax. Either output line Q or its inverse $\overline{Q}$ controls the state of one of the configuration transistors in a logic block such as shown in FIG. 3a or 3b. A preferred embodiment of this prior art memory cell achieves a known state on power-up and is described in U.S. Pat. No. 4,821,233 issued Apr. 11, 1989, incorporated herein by reference. The memory cell of FIG. 4 is loaded during configuration of the array. This configuration step requires that certain of the pins at the external perimeter of the array be used for configuration signals. When configuration is complete, these same external pins are most frequently configured to serve as data input or output pins. One or two pins have been used to switch the chip from configuration to operation mode but no provision has been available to alter these memory cells during operation after the configuration step is complete. Memory needed by a user during operation of such an array has generally been provided on a separate chip.

In some applications, it may be desirable to have memory distributed within the logic array, and to have the distributed memory available for access by the user during operation of the array. For example, in an application in which the user intends to use a configurable logic array chip as a combination central processing unit, a memory, and a first-in-first-out output buffer, it may be desirable to locate the memory storage close to where the information is generated. If the logic steps are performed by a logic block, storage of, say, one byte of information physically close to the logic block which generates the information requires less silicon area for interconnect lines and fewer interconnect transistors to route the generated information to its storage location.

SUMMARY OF THE INVENTION

The present invention provides means and method for programming a configurable logic block so that some of the configuration memory cells of the block can be changed during operation and may be used as a RAM (random access memory) for storing data of the user as well as for generating a logic function. The same logic block can be reconfigured so that at another time the memory cells which were once under control of the user during operation are configured to provide a static logic function which does not change during operation. The present invention offers flexibility not only in how certain memory cells are used but also in where within the logic array the user-accessible data cells are placed.

In one embodiment, the memory cells which may alternatively be used for storing data are those which store the lookup table used for configuring a combinatorial logic function which is within a logic block. Other memory cells may be used only for their configuration function and not alternatively for storing data, for example those which control the interconnection between logic blocks. The MUX memory cells which control connection of flip flops to other elements within a logic block may be alternatively used for data in one embodiment, though in a presently preferred embodiment these MUX internal configuration cells are used for configuration only. It is not presently preferred to use the MUX internal configuration cells alternatively for memory in an embodiment in which there are relatively few MUX configuration cells and the MUX configuration cells are not grouped in groups of eight such that they could be conveniently dedicated to storing at least a byte of information. To use the MUX cells for storage would result in a relatively inefficient use of the powerful logic options available with the preferred embodiment, therefore address lines necessary for such use are not presently provided.

When the option of allowing the user to store data in memory cells is available, there must also be provision for entering the user's data into these cells and reading from the cells. This option is provided by including two means for accessing each dual function cell, one which is used to supply off-chip signals during configuration of the cell and another which is used during operation to store signals which may be generated on-chip.

BRIEF DESCRIPTION OF THE DRAWINGS

FIG. 3c shows a representative logic function which can be implemented by two logic blocks of the type shown in FIG. 3b.

FIG. 3d shows the portions of logic which will be implemented h of the logic blocks.

FIG. 5b shows a portion of a configurable logic array incorporating the logic block of FIG. 5a.

FIG. 8 shows part of one circuit for providing the distributed memory cells of FIG. 6 in the logic block of FIG. 5a.

DETAILED DESCRIPTION OF THE INVENTION

Figure 7:
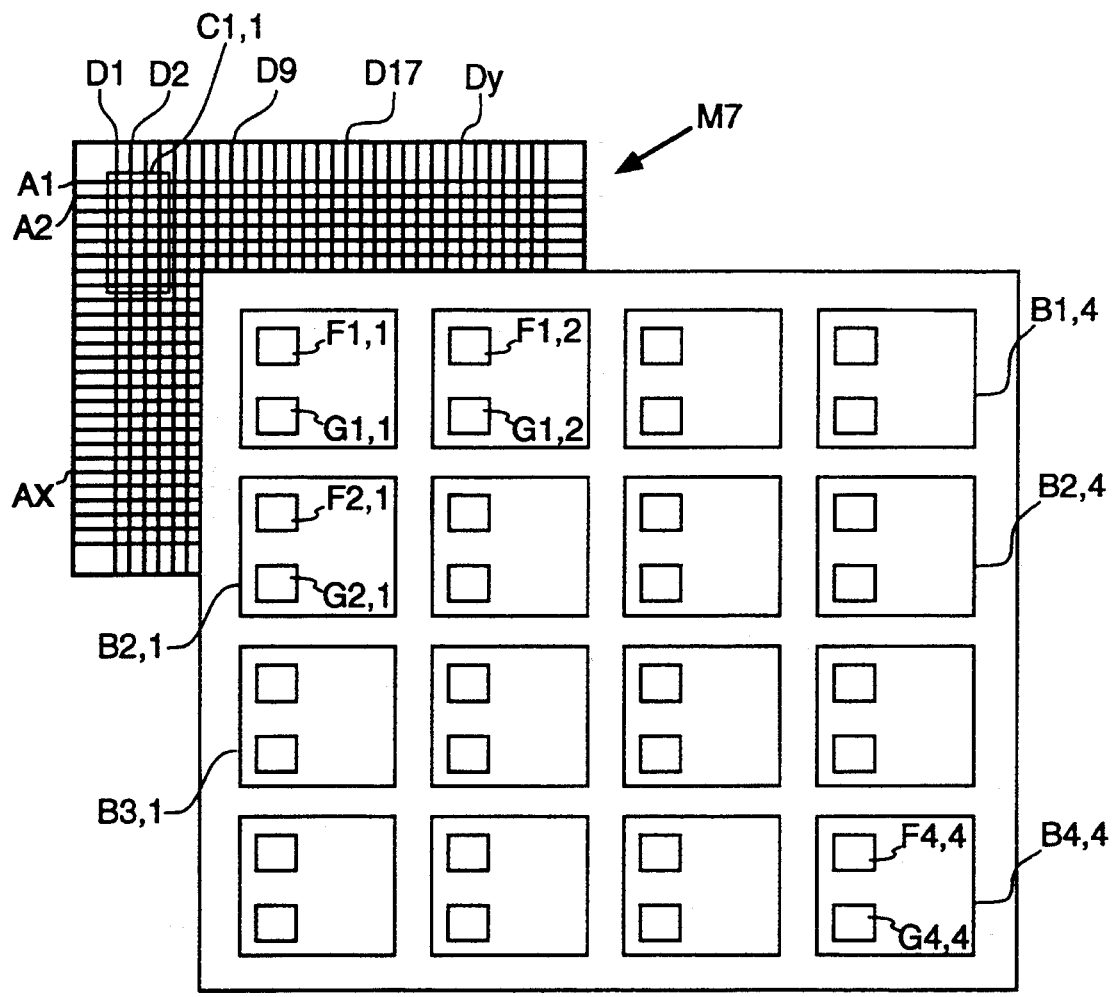
FIG. 7 shows a schematic representation of a logic array chip having logic blocks, each logic block providing two logic functions under control of a configuration memory array.

The overall structure of a logic array chip is represented in FIG. 7. FIG. 7 illustrates a logic array chip having 16 logic blocks. The principles discussed here will of course apply to a chip having any number of logic blocks. The logic blocks shown in FIG. 7 are identical, that is, they can all be programmed to perform the same functions. (Once they have been configured, each logic block performs a specific function as specified by the user, typically not identical to that of other logic blocks. Interconnect lines can provide outputs from one logic block as input to another logic block, again as specified by the user, The blocks in an array are generally not configured identically.) As a feature of the present invention, some of the blocks in an array may serve as memory devices rather than function generators. The user can build a logic system which contains combinatorial logic, flip-flops for logic storage, and groups of memory cells for data storage.

Figure 1:
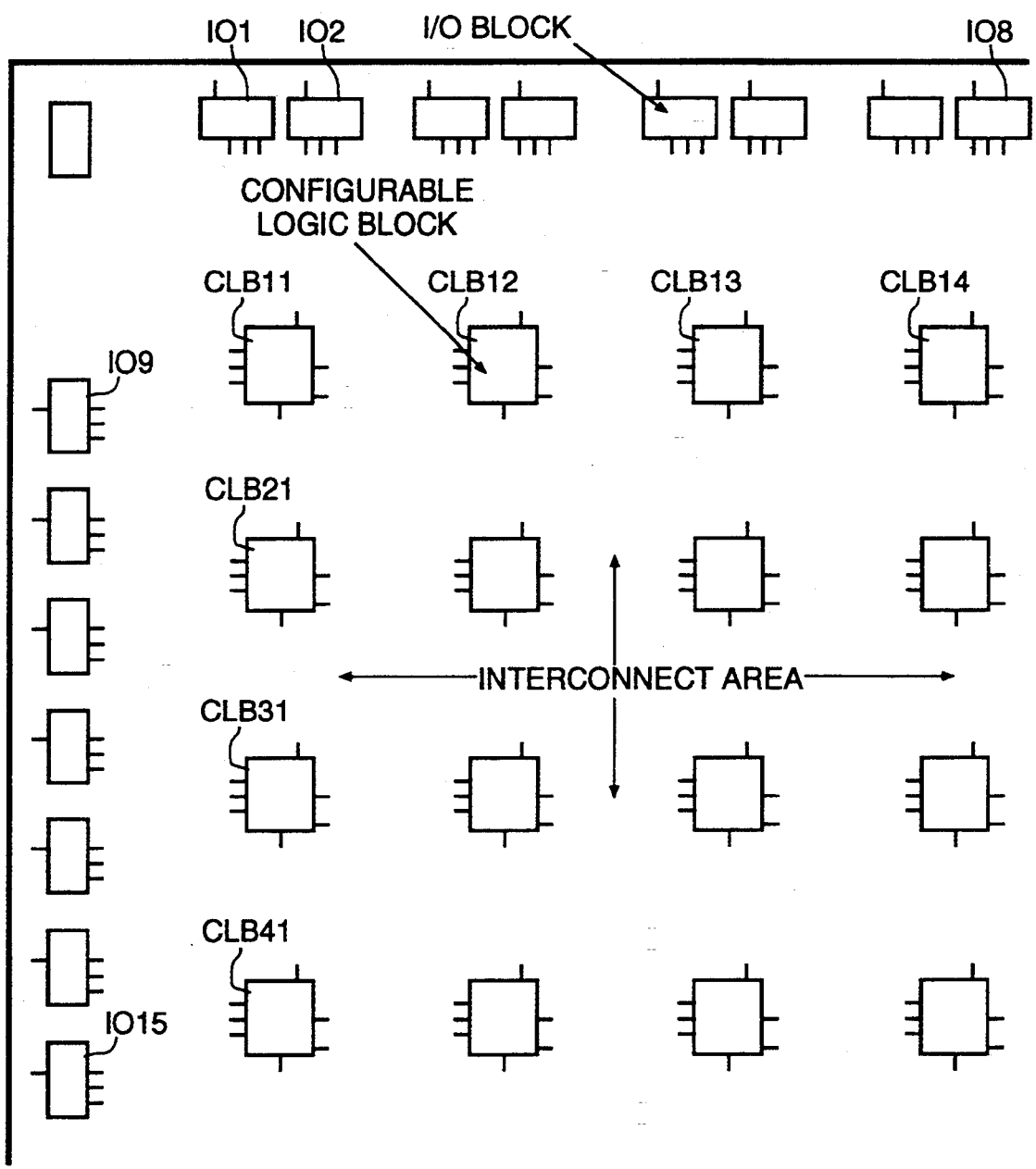
FIG. 1 shows part of one of the configurable logic array chips for which automatic programming is available.
Figure 2A:
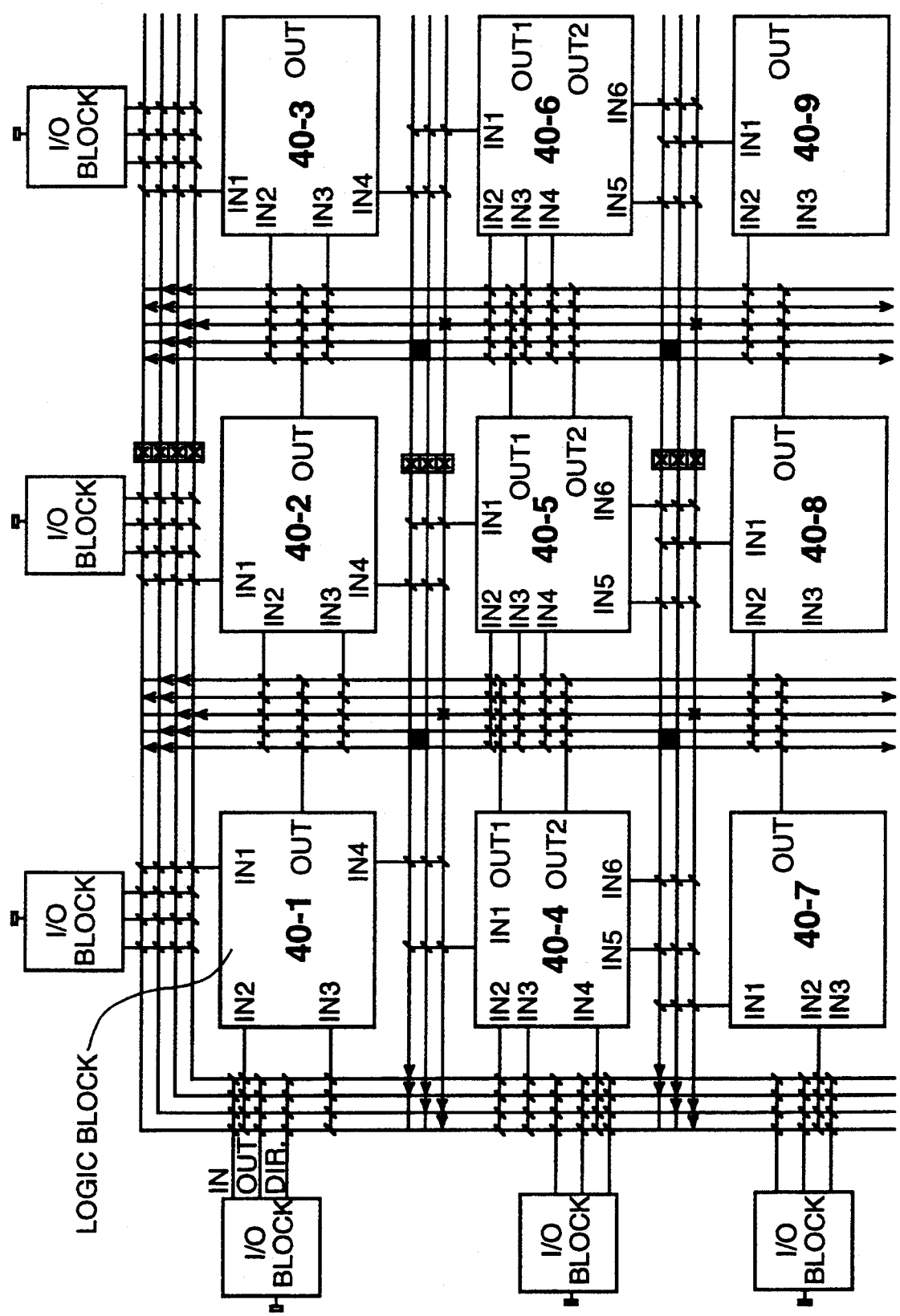
FIGS. 2A through 2D show a small portion of a configurable logic array chip with interconnects for connecting leads of one CLB or IOB to another CLB or IOB.
Figure 2B:
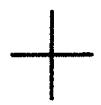
Figure 2B:
Figure 2B:
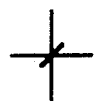
Figure 2B:
Figure 2B:
Figure 2B:
Figure 2B:
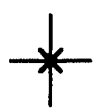
Figure 2B:
Figure 2B:
Figure 2B:
Figure 2B:
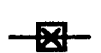
Figure 2C:
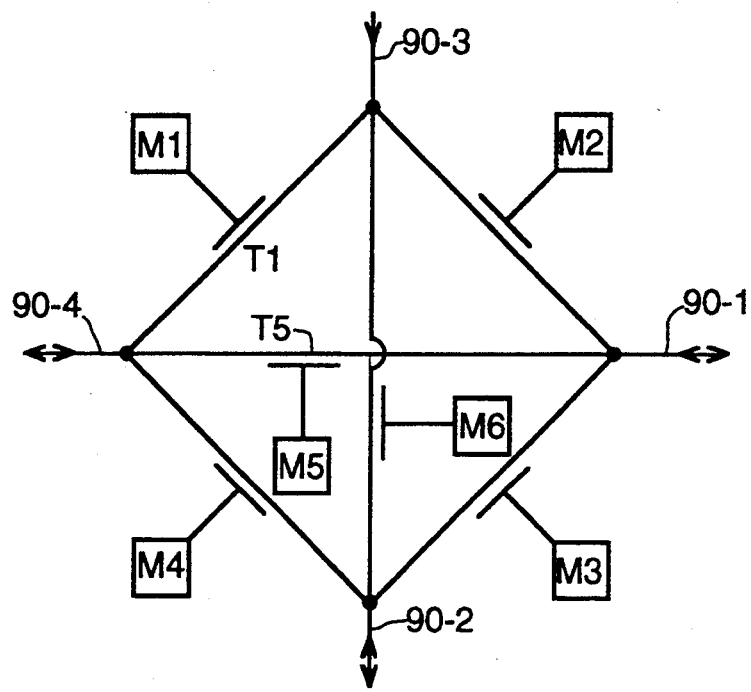
Figure 2D:
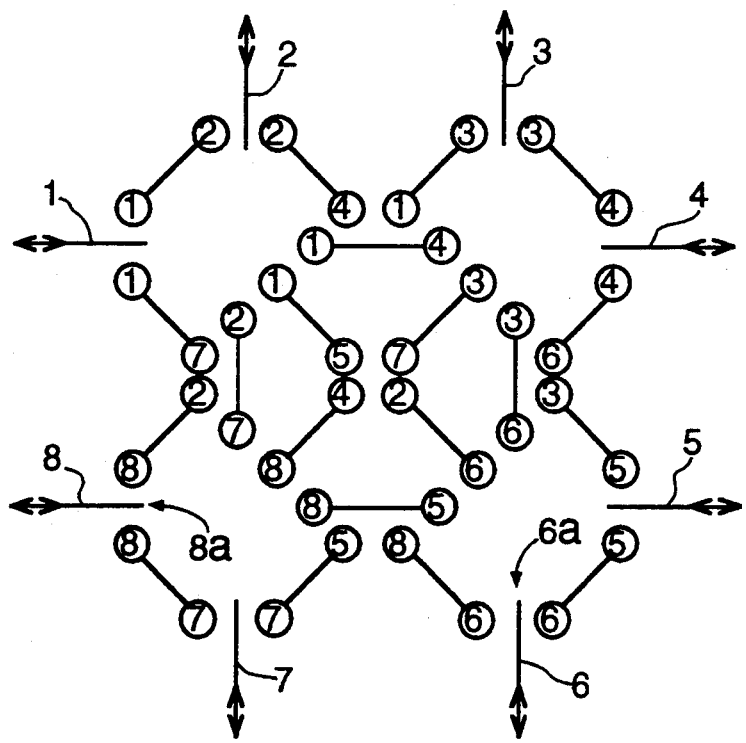
Figure 3A:
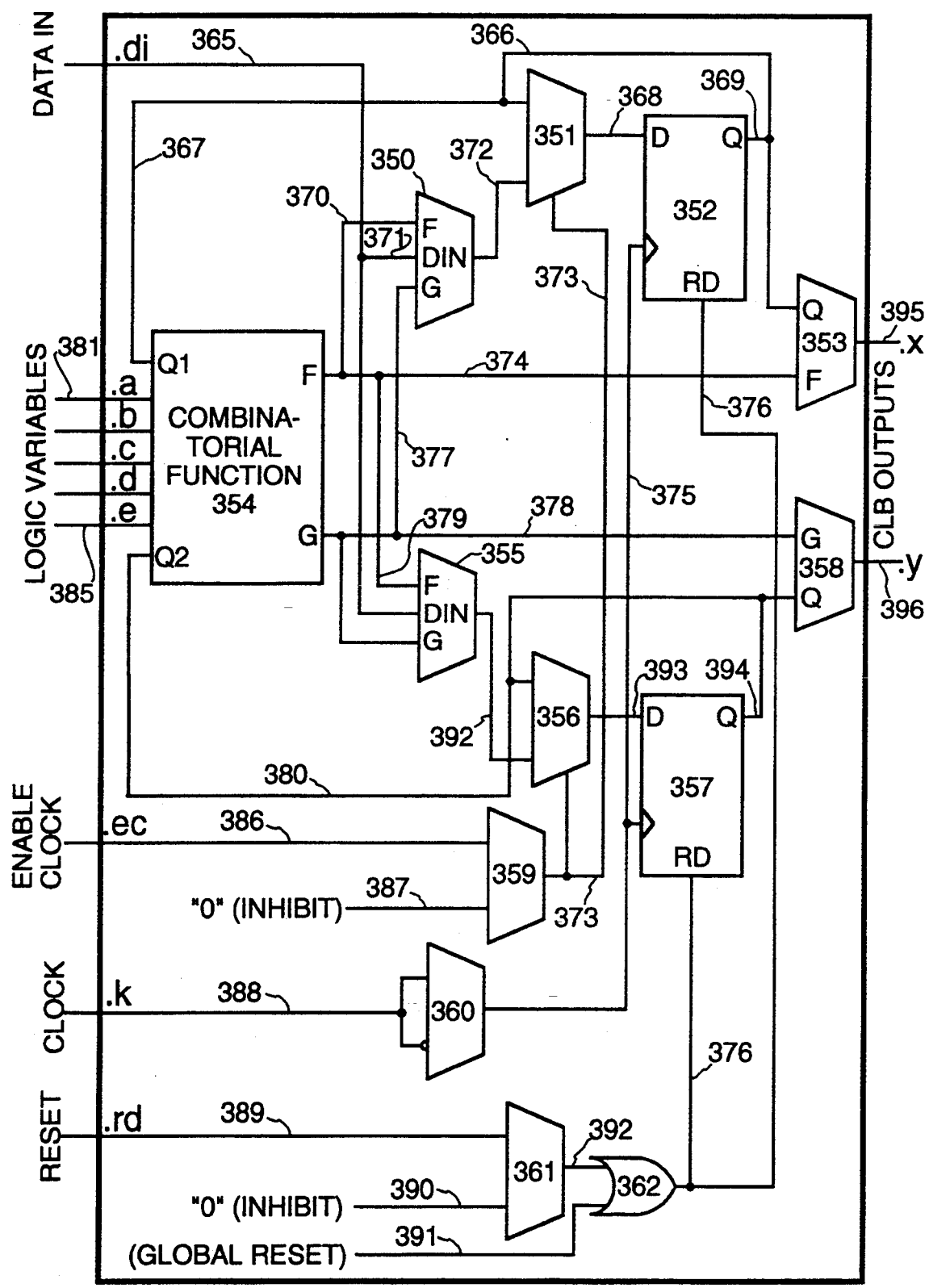
FIG. 3a shows one prior art configurable logic block.
Figure 3B:
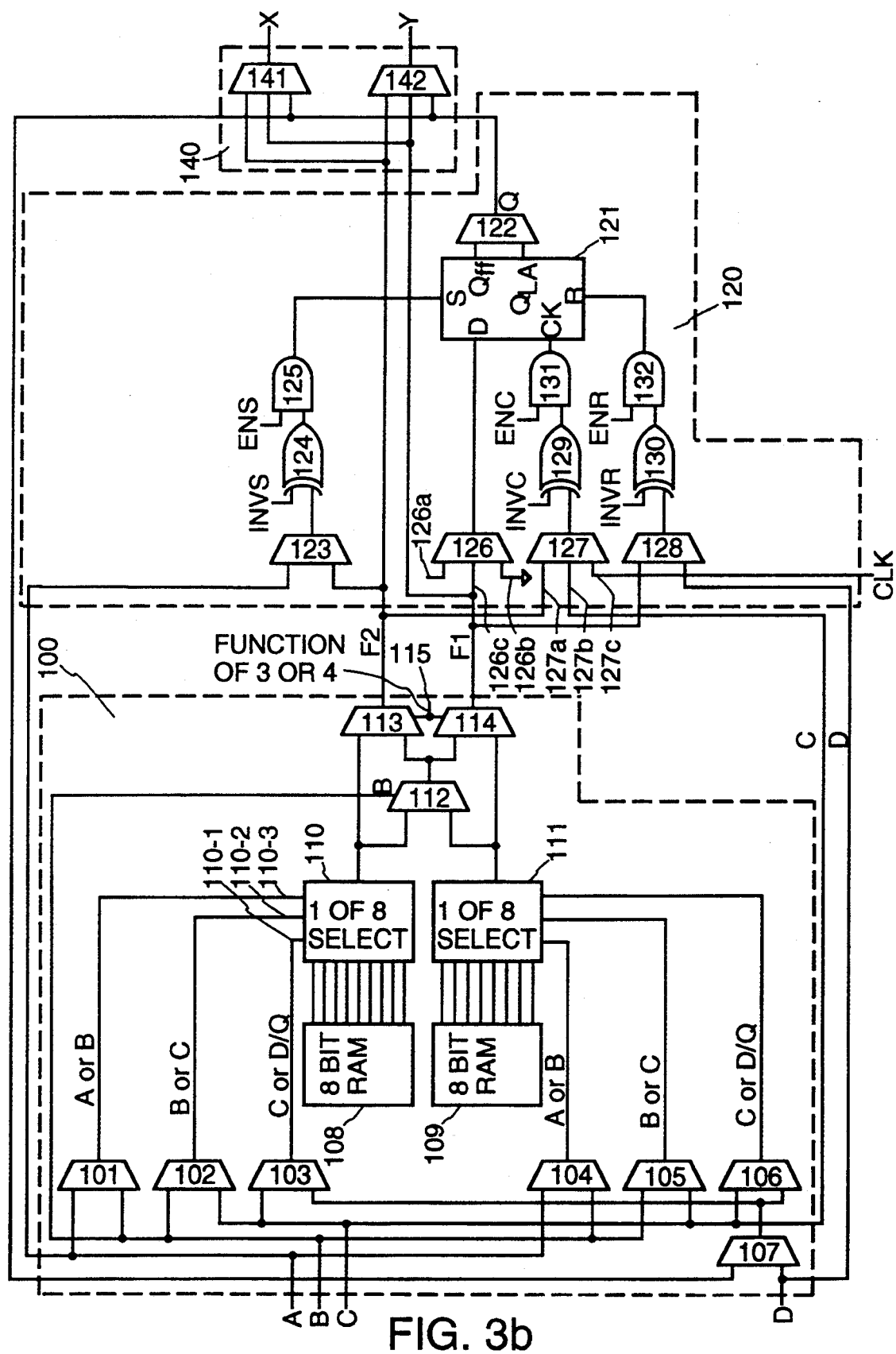
FIG. 3b shows another prior art configurable logic block in which memory cells for storing the configuration of the combinatorial logic functions are shown.
Figure 4:
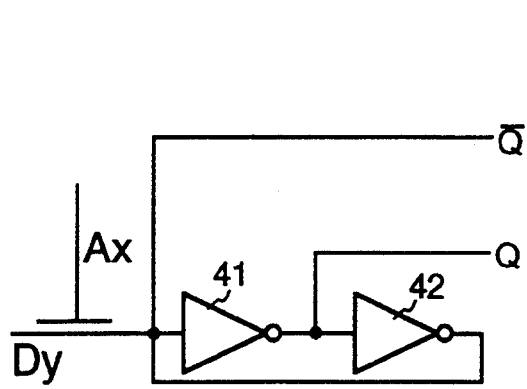
FIG. 4 shows a prior art 5-transistor memory cell of a type which can be used to configure the configurable logic blocks of FIG. 3a or 3b.
Figure 6:
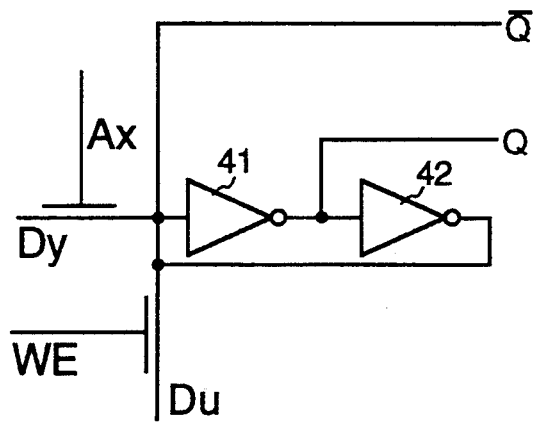
FIG. 6 shows a 5-transistor memory cell having dual access means for use with the present invention.

FIG. 7 includes a grid M7 of memory cells for configuring the sixteen logic blocks B1,1 through B4,4. Address lines A1 through A32 run horizontally and data lines D1 through D32 run vertically through grid M7. Ax and Dy denote representative address and data lines respectively. A memory cell is located at each intersection of the grid of FIG. 7. The group of memory cells C1,1 comprises a lookup table for the configuration of function generators F1,1 and G1,1 in block B1,1. The memory cells at the intersections of address line A1 through A4 and data lines D1 through D4 store the lookup table for the function generator F1,1 and each of them may be formed as shown in FIG. 6. The memory cells at the intersection of address lines A5 through A8 and data lines D1 through D4 store the lookup table for the function generator G1,1. Memory cells at the intersections of address lines A1 through A8 with data lines D5 through D8 store configuration information for other parts of the block B1,1 not part of the combinational function generators F1,1 and G1,1. These memory cells may be formed as shown in FIG. 4. Memory cells for the other blocks in FIG. 7 follow the same pattern.

In one embodiment, the combinatorial logic table memory cells at the intersection of address lines A1 through A32 and data lines D1–D4, D9–D12, D17–D20, and D25–D28 have the dual control shown in FIG. 6 so that they may be loaded during configuration of the chip by applying data on lines D1–D4, D9–D12, D17–D20, and D25–D28 while accessing cells through address lines A1 through A32, then loaded (written to) or read by other logic on the chip at any time during operation of the logic array as will be discussed below. Other memory cells preferably have the single access shown in FIG. 4.

Figure 5A:
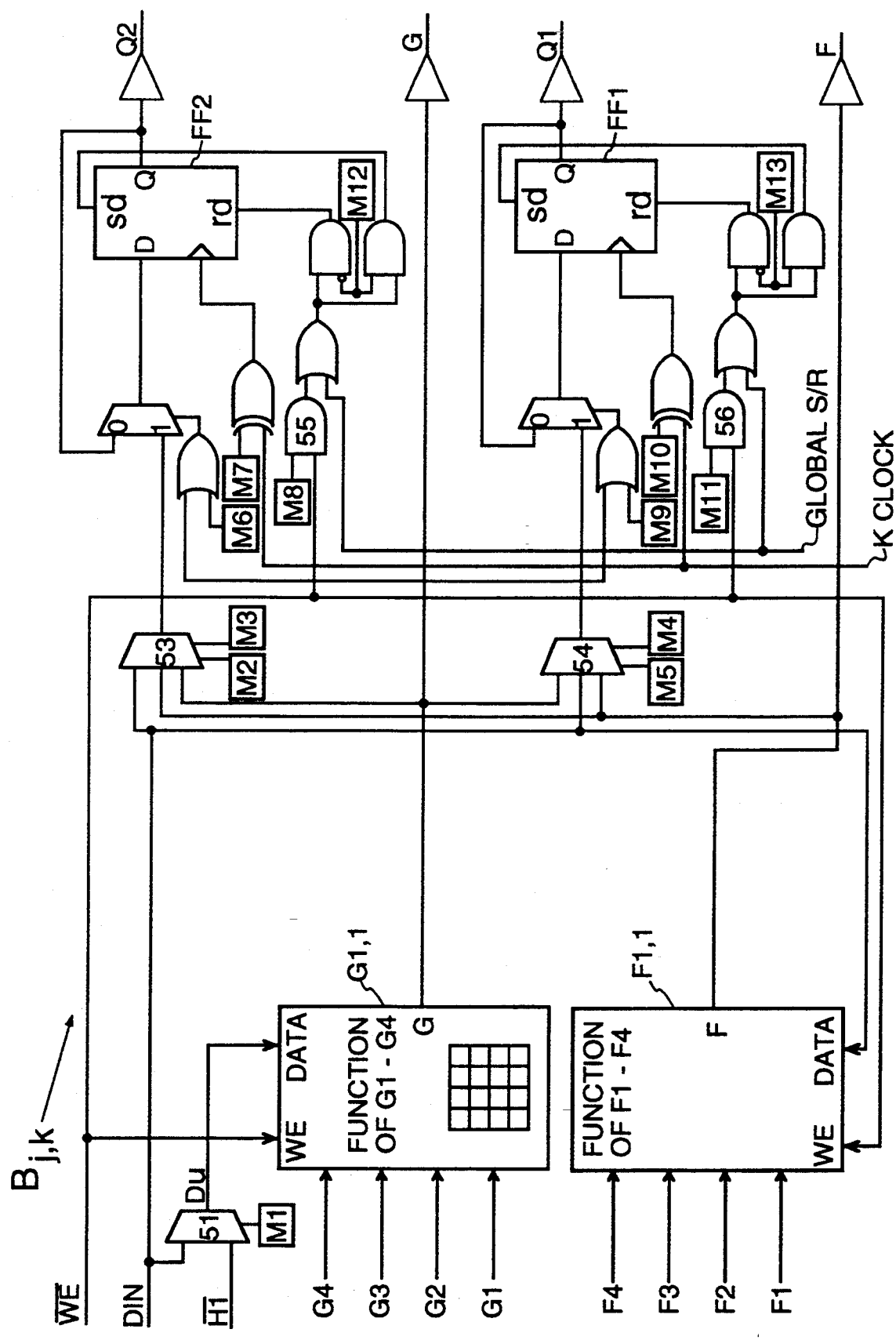
FIG. 5a shows a configurable logic block incorporating the present invention.
Figure 5B:
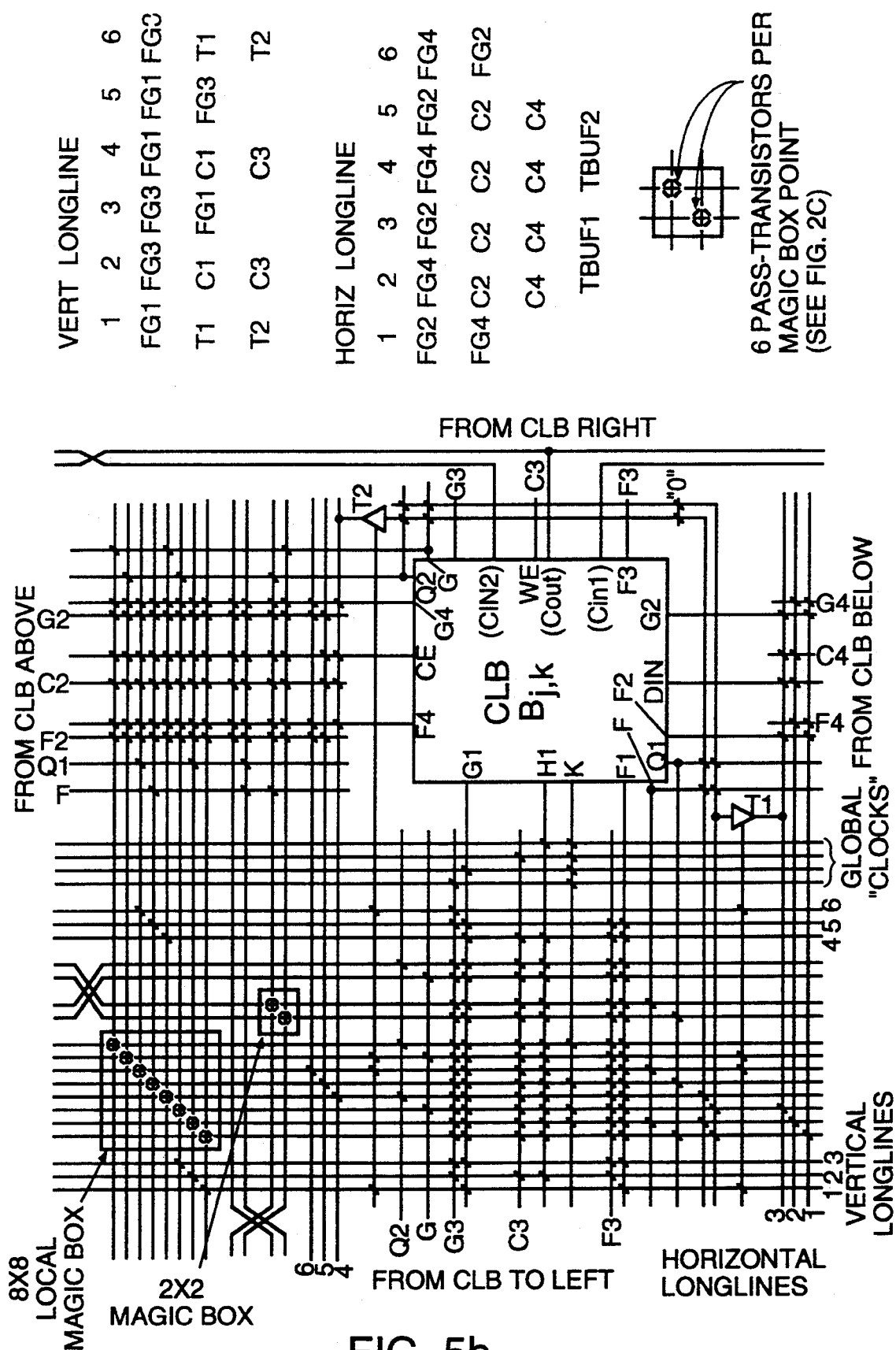

FIG. 5a shows a generalized one of the logic blocks Bj,k of FIG. 7 in more detail. FIG. 5b shows the configurable logic block of FIG. 5a surrounded by interconnect structure which is also part of the configurable logic array of FIG. 7. Reference numerals in FIG. 5b which are the same as those in FIG. 5a have the same meaning as they have in FIG. 5a. Referring to FIG. 5a, function generator F1,1 is a multiplexer which reads one of sixteen memory cells (shown in FIG. 7 as at the intersections of address lines A1 through A4 and data lines D1 through D4 but not shown in FIG. 5a) in response to an address provided on four input lines F1, F2, F3 and F4. The loading alternatives of the static memory cell of FIG. 6 make it possible to write into the memory cell of FIG. 6 at a time after the array is configured as well as during the configuration, making certain memory cells in each logic block of the array, for example memory cell Bj,k, separately available to the programmed logic. Previously, data for configuring a function generator came from outside the chip. With the present invention, the data in the function generators such as F1,1 and G1,1 of FIG. 5a are potentially generated on the chip. The user, when configuring the logic array will program the appropriate circuitry to generate the data for memory cells in any function generator being used for memory storage as well as to address these function generator memory cells. Further, with this invention, it is possible to read the memory cell contents during operation as well as to use the memory cell contents to control a logical operation performed by the logic block in which the memory cells reside. The user can write new data into the memory cells and he can then perform the new function represented by the new data or read the data out for use elsewhere in the logic array. Data can be changed one table at a time, under control of the logic programmed into the array. The architecture is more flexible and more efficient because the same memory cells can be used for more than one purpose. Since in a preferred embodiment, logic blocks have the same architecture throughout the array, the distributed memory provided by this invention can be used where needed.

The memory cells of this invention can be used as a RAM. If the user wants a byte-wide register set with 16 bytes of registers, he can program 8 function blocks to be loaded as a RAM, and control these 8 function blocks as a register. Similarly, if the user needs a 256 by 1 bit organization, the outputs of function blocks (each with 32 bits) are multiplexed together to form the required organization by configuring appropriate memory cells during configuration of the array.

Once the array has been configured and memory cells M1 through M5 of FIG. 5a have been set, the use of the memory cells which control function generators G1,1 and F1,1 is established. If they are to be used as memory, the memory contents can be changed, as RAM memory is typically changed, but the fact that the memory in function generators G1,1 and F1,1 can be changed will not be changed until memory cells M1 through M5 are changed. The memory contents in function generator F1,1 can also be used to generate a function F' of inputs F1, F2, F3, and F4. The same is true with function generator G1,1. But the function generator now has the property that other logic in the array can change the function performed by the logic block without the user having to reconfigure the entire logic array.

The circuit of FIG. 5a incorporates the two means for accessing memory cells such as shown in FIG. 6. Write enable line $\overline{WE}$ can be controlled by a user during operation of the cell to allow for loading data on line DIN into function generator F1,1 or on one of lines DIN or H1 through line Du into function generator G1,1.

The data loaded into the sixteen memory cells of function generator F1,1 or the sixteen memory cells of function generator G1,1 become the truth table entries provided in response to an address input on lines G1 through G4 or F1 through F4. Write enable line $\overline{WE}$ disables flip-flop storage means FF1 and FF2 by applying the low write-enable signal to AND gates 55 and 56, causing the set and reset inputs of flip-flops FF1 and FF2 to hold data present on their Q output ports regardless of signals applied to the D and clock input lines of flip-flops FF1 and FF2. Thus data provided on line DIN to load memory cells in function generators F1,1 and possible G1,1 is not provided through multiplexers 53 and 54 to flip-flops FF1 and FF2. As can be seen from FIG. 5a, line DIN can be used when the write enable line is high (function generators F1,1 and G1,1 are not being loaded) to provide data to flip flops FF1 and/or FF2 if memory cells M2 through M13 are programmed so that data on line DIN is received on the D input port of flip flops FF1 and/or FF2.

Application of the Dual Control of Memory Cells

Figure 8:
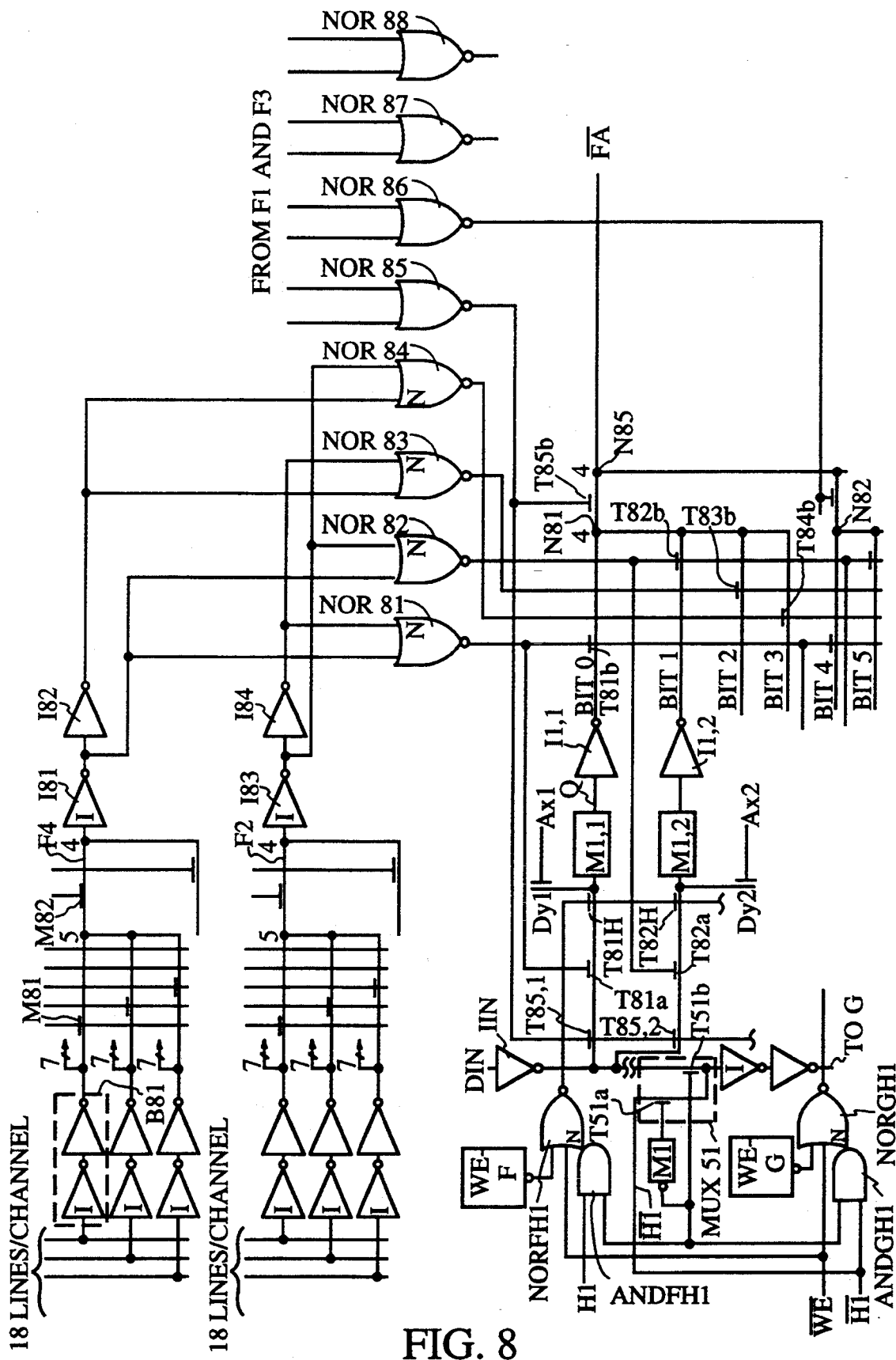

The dual means for controlling the memory cell of FIG. 6 as used in the function generators F1,1 and G1,1 of FIG. 5a will now be explained. The operation of function generators F1,1 and G1,1 is shown in more detail in FIG. 8. Function generator inputs F1 through F4 shown in FIG. 5a are shown in FIG. 8 as selected from among a plurality of signals. In one embodiment, 18 lines are provided from which to select the F4 input signal. Many variations and means for selecting from a plurality of signals are possible. FIG. 5b shows 16 lines from which the F1 signal is taken and 14 from which the F4 signal is taken, each line separately controlled by a memory cell. The variation shown in FIG. 8 provides for selecting the signal from only one of 18 lines by a two step selection process. The signal on each of these 18 lines is buffered through a buffer such as B81. The signals are grouped into three groups of five and one group of three signals. Pass transistors such as transistor M81 are controlled by a multiplexer to select one signal of each group of signals and pass transistors such as transistor M82 are controlled by this multiplexer to select one of the groups of signals, such that a single signal from the 18 lines is presented as the F4 signal. This F4 signal is inverted by inverter I81 and provided as input to NOR gates NOR81 and NOR82. The signal is inverted again by inverter I82 and provided as input to NOR gates NOR83 and NOR84.

A similar operation generates function F2 which is inverted by inverter I83 and provided as input to NOR gates NOR82 and NOR84, and inverted again by inverter I84 and provided to NOR gates NOR81 and NOR83. With this arrangement, only one of NOR gates NOR81 through NOR84 will provide a logical "1" output, thus only one of transistors T81b through T84b will be turned on.

As shown in FIG. 8, a plurality of memory cells, of which memory cells M1,1 and M1,2 are shown, each provide bits of a word stored in function generator F1,1. Each of the memory cells such as memory cells M1,1 and M1,2 are formed as illustrated in FIG. 6. In FIG. 8, the lines for configuring memory cells M1,1 and M1,2 during the process of configuring the entire logic array are labeled Dy1 and Dy2 respectively, and their respective address lines are labeled Ax1 and Ax2. (Of course, memory cells M1,1 and M1,2 may be configured by data applied under control of the same address line, Ax1 for example.)

If it is desired that memory cells M1,1 through M1,16 be accessible during operation of the logic array, memory cell WE-F will be loaded with a logical zero during configuration, thereby providing a logical one to NOR gate NORFH1 and enabling NOR gate NORFH1 to respond to a write enable signal on line $\overline{WE}$ if NOR gate NORFH1 is also enabled by AND gate ANDFH1.

FIG. 8 does not show the memory cells of the G function generator G1,1, nor does it show means for addressing the memory cells of the G function generator. However, the memory cells of the G function generator F1,1 are addressed, read, and written by circuitry which is identical to that for addressing the F function generator except for the following differences which are shown in FIG. 8. The signal H1 is provided to AND gate ANDFH1 and its complement $\overline{H1}$ is provided to AND gate ANDGH1. Multiplexer MUX 51 selects which of signals DIN and $\overline{H1}$ are provided to the G function generator. If signal DIN is provided to the G function generator, only one of the F function generator and the G function generator will be addressed at one time, since H1 and $\overline{H1}$ are complementary signals. Thus the single data line DIN can be used for providing data to memory cells in both F function generator F1,1 and G function generator G1,1. The embodiment discussed in detail here uses 16 memory cells in each of function generators F1,1 and G1,1, and uses four input lines to address each of these sets of memory cells. It is clear that the invention is not limited to this embodiment, since other numbers of memory cells and address lines, for example 128 memory cells and six address lines, could also be used. Further, a logic block need not be limited to providing two functions.

Use of Function Generators F and G to Store a Single 32-bit Word or Two 16-bit Words In the embodiment of FIG. 8, there are sixteen memory cells, M1,1 through M1,16 in function generator F1,1 of which only two are shown. Control of the remaining memory cells can be understood from the level of detail shown in FIG. 8. Memory cell M1 enables both AND gate ANDFH1 and AND gate ANDGH1 and determines whether the logic block of FIG. 5a will treat the 32 memory cells in function generators F1,1 and G1,1 as a single bank of 32 cells for which a single output is selected in response to signals on the eight lines F1 through F4 and G1 through G4, or whether the logic block of FIG. 5a will treat the 32 memory cells in function generators F1,1 and G1,1 as two banks of 16 cells each, for which separate outputs are selected, an F output in response to signals on lines F1 through F4 and a G output in response to signals on lines G1 through G4. Data to be written to memory cells of the F function generator F1,1 (for example memory cells M1,1 and M1,2) are provided on line DIN (shown in both FIG. 5a and FIG. 8).

A logical 1 in memory cell M1 produces a logical 0 on the inverted output of memory cell M1, turning off transistor T51b of MUX 51 and disabling the H1 and $\overline{H1}$ inputs to AND gates ANDFH1 and ANDGH1 respectively. The logical 1 in memory cell M1 turns on transistor T51a in MUX 51, which allows the signals on line $\overline{H1}$ to be used as data signals to function generator G1,1. A logical 0 in memory cell M1 turns off transistor T51a so that the signals on line Hi are not provided as data to G function generator G1,1. The high signal provided on the inverted output of memory cell M1 turns on transistor T51b, causing the G function generator G1,1 to receive data on line DIN. This high signal on the inverted output of memory cell M1 is also provided to AND gates ANDFH1 and ANDGH1, enabling the signal on lines H1 and $\overline{H1}$ to be provided to NOR gates NORFH1 and NORGH1 respectively. As can be seen in FIG. 8, a logical 1 in memory cell WE-F produces a logical 0 to NOR gate NORFH1. The combination of a logical 1 in memory cell WE-F, a logical 0 in memory Cell M1 (producing a logical 0 to AND gate ANDFH1) and a low signal on write enable line $\overline{WE}$ allows a high signal on line $\overline{H1}$ (logical zero on line H1) to cause NOR gate NORFH1 to place a high signal on transistor T81H so that memory cells M1,1, M1,2 and other memory cells (fourteen others in this embodiment) in function generator F1,1 can be written to in response to addresses provided on lines F1 through F4 as decoded by nor gates NOR81 through NOR88 to control transistors such as T85,1 and T81a.

Decoding the Input Data Signals F1 through F4

Only one of memory cells M1,1 through M1,16 will be connected at any one time to line DIN by having all three of its write enable transistors such as T85,1, T81a and T81H turned on. In the embodiment of FIG. 8, the decoding is performed in two stages (other decode logic is also possible, as is well known). Writing to memory cells M1,1 through M1,4 is controlled by NOR gate NOR85 which provides a high output signal only when lines F1 and F3 are low. Three other groups of memory cells M5 through M16 (not shown) are addressed by other combinations of signals on lines F1 and F3.

Taking the case when lines F1 and F3 are low, transistors T85,1 through T85,4 will be high. If lines F2 and F4 are low, NOR gate NOR81 will provide a high output signal (and NOR gates NOR82 through NOR84 will all provide low output signals). The high output signal on NOR gate NOR81 will turn on transistors T81a and T81b. If transistor T81H is also on, the data on line DIN as inverted by inverter IIN will be written to memory cell M1,1.

Writing to and Reading from Memory Cells M1,1 through M1,16

Since transistors T81b and T85b are also turned on by the combination of low signals on lines F1 through F4, the data on DIN which is inverted and entered to memory cell M1,1 will be inverted again by inverter I1,1 and provided on F function generator output line $\overline{FA}$. (Of course, rather than providing a separate inverter I1,1, it is possible to provide the $\overline{Q}$ output of memory cell M1,1 to the output line $\overline{FA}$ of function generator F1,1. And rather than providing inverters I1,1, I1,2, etc on each of sixteen cells M1,1 through M1,16, it is possible to provide a single inverter to invert and buffer the signal on node N85. However such an embodiment is not preferred because signal propagation would be slower.

If memory cells M1 through M16 are configured as RAM storage, in the embodiment of FIG. 8, they will be read as serial output on the $\overline{FA}$ output line from F function generator F1,1. The F output signal from function generator F1,1 shown in FIG. 5a is derived by providing the $\overline{FA}$ output signal of FIG. 8 to an inverter. This data is accessed by connecting, during configuration of the array, the F output line shown in FIG. 5b to a desired input line of another configurable logic block like that shown in FIG. 5b located in another part of the array. As shown in FIG. 5b, the four signals $\overline{HI}$, DIN, $\overline{WE}$ and clock enable signal CE can be taken from interconnect lines physically spaced apart around the logic block. In one embodiment these signals are decoded within the logic block and applied to desired lines, adding another level of programmability.

Of course many other embodiments which provide for loading data both during configuration of the logic array cell and for loading data during operation of the logic array cell are also possible.

In light of the above disclosure, other embodiments of the present invention will become obvious to those skilled in the art. For example, though a table look-up means of using memory cells to provide a combinatorial logic function has been described, other arrangements are also possible such as using memory cells to connect or disconnect AND, OR, XOR, and invert logic gates. For another example, though a memory cell comprising two inverters in series has been described, a typical six-transistor static memory cell can be used and provided with access from two sources. For yet another example, although a logic block having two function generators is shown, it is clear that logic blocks having other numbers of function generators can also be provided, and that memory cells within a plurality of function generators can be controlled to provide different numbers of words of output. Such variations are intended to fall within the scope of the present invention.

We claim:

1. In a field programmable logic device having a programmable interconnect structure and a plurality of logic blocks, each logic block comprising at least one lookup table having memory cells which can be loaded from a bitstream during configuration of said field programmable logic device and loaded from said interconnect structure during operation of said field programmable logic device, a method of using said field programmable logic device comprising the steps of:

configuring said logic blocks by loading said bitstream into said memory cells;

operating said field programmable logic device in a first configuration loaded from said bitstream for a first period of time;

after said first period of time, reconfiguring at least one of said logic blocks by loading data from said interconnect structure into at least one of said memory cells; and operating said field programmable logic device in a second configuration determined by both said bitstream and said interconnect structure for a second period of time.

2. In a field programmable logic device having a programmable interconnect structure and a plurality of logic blocks, each logic block comprising at least one lookup table having memory cells which can be loaded from a bitstream during configuration of said field programmable logic device and loaded from said interconnect structure during operation of said field programmable logic device, a method of using said field programmable logic device comprising the steps of:

designating at least a first lookup table as a RAM and at least a second lookup table as a logic device;

configuring said field programmable logic from said bitstream with a configuration which allows said first lookup table to be accessed from said interconnect structure;

operating said first lookup table as a RAM, thereby accessing said RAM through said interconnect structure; and operating said second lookup table as a logic device, thereby using said second lookup table to generate logic signals.

3. The method of claim 2 comprising the further steps of:

designating a third lookup table as a logic device;

loading said field programmable logic device with a configuration which allows said third lookup table to be loaded from said interconnect structure; and operating said third lookup table as a logic device.

* * * * *

UNITED STATES PATENT AND TRADEMARK OFFICE
CERTIFICATE OF CORRECTION

PATENT NO. : 5,432,719
DATED : July 11, 1995
INVENTOR(S) : Ross H. Freeman, deceased, and Hung-Cheng Hsieh, deceased It is certified that error appears in the above-indentified patent and that said Letters Patent is hereby corrected as shown below:

Col. 5, line 65, "implemented h of" should read --implemented by each of--.

Col. 6, line 29, "user, The" should read --user. The--.

Col. 10, line 7, "Hi" should read --H1--.

Signed and Sealed this

Seventh Day of November, 1995

Attest:

BRUCE LEHMAN

Attesting Officer    Commissioner of Patents and Trademarks